United States Patent
Staudigel

(10) Patent No.: US 10,286,622 B2
(45) Date of Patent: May 14, 2019

(54) CONDUCTORS INTEGRATED IN A WATERTIGHT MANNER IN SANDWICH COMPONENTS

(71) Applicant: Diehl Aircabin GmbH, Laupheim (DE)

(72) Inventor: Norbert Staudigel, Neu-Ulm (DE)

(73) Assignee: Diehl Aircabin GmbH, Laupheim (DE)

( * ) Notice: Subject to any disclaimer, the term of this patent is extended or adjusted under 35 U.S.C. 154(b) by 231 days.

(21) Appl. No.: 15/041,234

(22) Filed: Feb. 11, 2016

(65) Prior Publication Data

US 2016/0236780 A1   Aug. 18, 2016

(30) Foreign Application Priority Data

Feb. 18, 2015  (DE) .................... 10 2015 002 083

(51) Int. Cl.
*B32B 7/12*   (2006.01)
*B64D 45/00*   (2006.01)
(Continued)

(52) U.S. Cl.
CPC ............... *B32B 3/12* (2013.01); *B32B 7/12* (2013.01); *B32B 37/146* (2013.01); *B32B 37/12* (2013.01);
(Continued)

(58) Field of Classification Search
CPC ............ H05K 3/284; B64D 2011/0046; B64D 45/00; H01L 23/3107; H01L 23/3114;
(Continued)

(56) References Cited

U.S. PATENT DOCUMENTS 4,860,509 A * 8/1989 Laaly ............... H01L 31/03926
                                                       136/245
6,215,060 B1 * 4/2001 Komori .................. B32B 27/08
                                                       136/251
(Continued)

FOREIGN PATENT DOCUMENTS

DE   102009014348 A1   12/2009
DE   102010027005 A1   1/2012
DE   102011109696 A1   2/2013

OTHER PUBLICATIONS

English Abstract of WO 2013/020627 A1, dated Feb. 14, 2013.

*Primary Examiner* — Scott W Dodds
(74) *Attorney, Agent, or Firm* — Scully Scott Murphy and Presser

(57) ABSTRACT

In a method for manufacturing a sandwich component having a first and a second flat side, in a pre-assembly state all components of the sandwich component in relation to one another are placed in a nominal position: at least one shape-imparting structural layer and a conductor layer having an electrical conductor, and are connected in an assembly step with an adhesive, wherein in the pre-assembly state on both sides of the conductor layer two barrier layers which are vapor-tight are placed as further components and interconnected in such a manner that said two barrier layers enclose the conductor in a vapor-tight manner. A sandwich component having flat sides, manufactured according to the above method, has at least the structural layer and the conductor layer with the conductors, said structural and conductor layers being disposed between the flat sides and connected with the adhesive, and on both sides of the conductor layer the barrier layers as further components are interconnected in such a manner that said two barrier layers enclose the conductor in a vapor-tight manner.

12 Claims, 2 Drawing Sheets

(51) Int. Cl.
 *B32B 3/12* (2006.01)
 *B32B 37/14* (2006.01)
 *B32B 37/12* (2006.01)
 *H01L 23/31* (2006.01)

(52) U.S. Cl.
 CPC ..... *B32B 2305/34* (2013.01); *B32B 2307/202* (2013.01); *B32B 2327/12* (2013.01); *B32B 2605/18* (2013.01); *B64D 45/00* (2013.01); *H01L 23/3107* (2013.01); *Y10T 156/103* (2015.01)

(58) Field of Classification Search
 CPC ............ H01L 23/3142; H01L 51/5246; Y10T 428/239; Y10T 156/103
 USPC ....................................................... 156/288
 See application file for complete search history.

(56) References Cited

U.S. PATENT DOCUMENTS

| | | | |
|---|---|---|---|
| 6,319,596 B1 * | 11/2001 | Kernander | B32B 27/28 428/215 |
| 2002/0036898 A1 * | 3/2002 | Miyakawa | H05K 3/284 361/757 |
| 2007/0158501 A1 * | 7/2007 | Shearer | B64D 13/00 244/118.5 |
| 2011/0155222 A1 | 6/2011 | Ehbing et al. | |
| 2012/0012703 A1 | 1/2012 | Schmid et al. | |

* cited by examiner

CONDUCTORS INTEGRATED IN A WATERTIGHT MANNER IN SANDWICH COMPONENTS

BACKGROUND OF THE INVENTION

The invention relates to a sandwich component and to a method for manufacturing the same.

DISCUSSION OF THE PRIOR ART

It is known, for example from DE 10 2010 027 005 A1, for cabin components for aircraft to be created in a sandwich construction design, that is to say as sandwich components, and for electronic components to be disposed within the sandwich construction.

Due to condensate arising behind the sandwich component, there is a requirement for many sandwich components in the form of cabin panels in aircraft to be electrically stable in relation to water droplets. That is to say that electrical components on or in the sandwich component must have respective stability. Respective IP classifications (International Protection) here are defined by DIN IEC 60529 "Classification of protection by housings (IP Code)", for example. Moreover, the electrical cabling in the aerospace industry is regulated for example by the standard DIN EN 3197 "Design and installation of aircraft electrical and optical interconnection systems".

In practice, it has been usual and known to date for conductors and electronics to be protected from water by means of separate housings, seals, and sheathings.

SUMMARY OF THE INVENTION

The present invention is directed to an improved sandwich component and an improved manufacturing method.

A sandwich component is manufactured by way of the method. The former after manufacturing has a first and a second flat side, the latter lying opposite the former. The sandwich component is in particular a cabin panel for a passenger cabin of a vehicle, in particular of an aircraft.

In a pre-assembly state, all components for the sandwich component to be created are placed in a nominal position in relation to one another. The placed components then thus have a determined or predefined or nominal relative mutual position. The pre-assembly state is that state in which the components of the sandwich component are prepared for the later assembly step, or are placed in a mutually locationally correct manner or are layered, in particular laid up in a sandwich mould, respectively. "All components" here also comprise further and even optional components to be mentioned later or hereunder, respectively, which are also co-processed in the assembly step in order for the sandwich component to be formed.

One of the components is a shape-imparting structural layer. The structural layer is in particular a honeycomb core. One of the components is a conductor layer having at least one electrical conductor. The conductor is in particular a copper conductor.

All components are interconnected in an assembly step with the aid of an adhesive, in particular under the influence of pressure and/or heat. The adhesive is in particular a resin. The sandwich component (also referred to as a composite component) is thus produced in the assembly step. Here, the first and a second flat side are configured on the component. The flat sides delimit the sandwich component in relation to the external space. The assembly step is that step in which the components of the sandwich component are baked or adhesively bonded in particular in a mould, so as to form the finished sandwich component.

Moreover, two barrier layers which in each case are vapour-tight and in particular are diffusion barriers are placed as further components in the pre-assembly state. The barrier layers in particular are polyvinyl fluoride layers. In each case one of the barrier layers is placed on in each case a side of the conductor layer that faces towards the later first and towards the later second flat side. In other words, the barrier layers are placed on both sides of the conductor layer, so as to be between the flat sides in the layered construction. The two barrier layers form further components which in the assembly step are co-processed to form the sandwich component. The first and second barrier layers may also be two parts of an integral barrier layer which is folded, for example, and which then runs on both sides of the conductor layer. In other words, the barrier layer forms a diffusion barrier against vapour. In this way, said barrier layer is also resistant to water in liquid form, in particular. In particular, the polyvinyl fluoride (PVF) material used is the product "Tedlar" by the "DuPont" company. Tedlar has the advantage of being readily capable of adhesive bonding, of being fire resistant and diffusion-tight, and of being permitted for aerospace applications, that is to say of having passed specific flammability tests, for example. Moreover, it is gas-tight and thus allows conductors to be installed in the proximity of a gas line, in particular an oxygen line.

The two barrier layers are interconnected in such a manner that the former after the assembly step enclose the conductor in a vapour-tight manner. In particular, connecting is performed laterally to the conductor. "Tightly enclosed" means that the conductor is enclosed at least at those points at which the conductor is to remain accessible in a targeted manner through the barrier layers, for example in a line portion with which electrical contact is to be established at a later stage. Interconnecting the two barrier layers is carried out in such a manner that the two barrier layers are either directly connected, for example welded or tightly wrapped to one another, or are connected to one another in a tight manner by interdisposing a further material layer, for example an adhesive, in particular a resin. The point in time at which the two barrier layers are interconnected may also be prior to the point in time at which the pre-assembly step takes place, for example. "Tightness" here is not to be understood as being absolute, but rather always in the context of usual limit values, for example in the context of the abovementioned standards.

The adhesive does not constitute a "component" in the above context. However, the adhesive is laid up in particular in the pre-assembly state as a separate layer, in particular in the form of an adhesive sheet, on or between other components or layers of the sandwich component. During the assembly step, the adhesive liquefies, and is distributed in the sandwich component, and finally cured, in particular.

The invention is based on the following concepts: the abovementioned required resistance to water droplets which applies to sandwich components critically depends on the installed position of the sandwich component in the vehicle. In this way, water droplets may impinge the component surface or flat side, respectively, obliquely from above or perpendicularly from above. The component may be additionally exposed to vapour which is located in the environment of the component, or the component may be wetted by an entire water film.

The invention is thus based on the fundamental concept of designing the sandwich component in terms of the electrical elements thereof not only in respect of water droplets, but with a view to a higher protection classification, for example spray-tight or water-tight (that is to say IP65 for example, tightness when submerged). Protection against water droplets of any kind but also against other types of moisture or water, respectively, is then always given.

According to the invention, the electrical conductors are therefore enclosed by polyvinyl fluoride layers in a completely vapour-tight manner. In this way, a protective sleeve which encloses the conductor and which is completely tight in respect of vapour as well as of water in liquid form is created. On account of the particular layered construction it is possible for the conductor to be embedded in the sandwich component such that water-tightness is achieved. On account thereof, constructions which meet protection class IP67 become possible, without an additional protective housing having to be provided. According to the invention, a water-tight conductor which is integrated in the sandwich component thus results. The invention is based inter alia on stating a special layered construction such that the integrated vapour barriers are indeed effective also when used in conjunction with and for sealing, respectively, external parts such as plugs.

On account of the invention, the advantage is derived that an otherwise required protective housing is dispensed with. This in turn leads to a saving in weight. Moreover, a multiplicity of seals are saved. According to the invention, LED light strips on sandwich components or an LED starry sky theme for example may be realized by establishing electrical contact between the conductors which are integrated in the component and LEDs which then emit light from the component.

In one preferred embodiment of the method, the two barrier layers are interconnected during the assembly step. Connecting here is carried out in particular with the aid of the adhesive. In this way, the barrier layers in the pre-assembled state may simply be laid up on both sides of the conductor layer. Said barrier layers are then interconnected in a single method step in the context of the overall completion of the sandwich component. A separate connecting step for the barrier layers is dispensed with.

In one preferred embodiment of the method, the two barrier layers are connected in that the latter in the form of lateral protrusions protrude beyond the conductor. The protrusions are then interconnected in a tight manner. Connecting is carried out with the aid of the adhesive, in particular. The adhesively bonded protrusions here in terms of the dimensions thereof are sized such that the former are sufficiently wide so as to be vapour-tight towards the conductor even in any gap remaining between the barrier layers, in particular in a gap filled with adhesive. "Lateral" in terms of the layered construction is to be understood as that direction that is parallel with the flat sides beside the conductor, that is to say not between the conductor and the flat sides. A protrusion of 5 mm, for example, is typically sufficient in order for two Tedlar films to be adhesively bonded in a vapour-tight manner in the assembly step with the aid of a resin which is in particular sourced from a prepreg component.

In one preferred embodiment, the barrier layers in the pre-assembled state are disposed on both sides of the conductor layer as directly adjacent components. There are thus no further components present between the conductor layer and the respective barrier layers on both sides. Only elements which do not constitute "components" according to the abovementioned definition, for example an adhesive or an adhesive layer, respectively, may be interlayered. For example, an adhesive layer may be laid up in a targeted manner between the barrier layers in the pre-assembly state, if and when there is otherwise no adhesive available on the conductor layer and/or the barrier layers, in order for the barrier layer to be bonded to the conductor layer in the assembly step.

In one preferred embodiment, a conductor layer which contains a supporting layer is incorporated as a component in the pre-assembly state. The supporting layer is an adhesive layer and/or a fibrous layer, in particular. The supporting layer at least in the pre-assembly state fixes the conductor in the nominal position in relation to the other components.

The sandwich component typically or in preferred embodiments, respectively, in any case contains one or a plurality of fibrous layers as further components. In the finished state, each fibrous layer imparts additional mechanical strength to the sandwich component. The fibrous layers are provided on or within the component in various positions, respectively, for example also as a terminal layer on the respective flat sides, in other words such that the fibrous layers form the flat side. The fibrous layer is a glass-fibre layer, for example, in particular a woven glass-fibre fabric, which moreover and in particular contains an adhesive. Said fibrous layer is then referred to as a prepreg. The supporting layer is thus in particular a prepreg layer. A prepreg (pre-impregnated fibres) is a semi-finished product which is typically composed of a reactive resin and of endless fibres. Curing of prepregs takes place at high temperatures in a pressurized manner. In the assembly step, typically during heating, the resin of the prepreg layer liquefies and embeds the fibres of this layer prior to the resin being cured. The liquefied resin here also spreads to the surroundings of the prepreg layer and wets components bearing on said resin, for example the barrier layer, the honeycomb cores, or the electrical conductor, so as to finally embed, or retain, or to adhesively interbond the latter items in the sandwich component, respectively.

Fixing of the conductor to the supporting layer in particular takes place in a prefabricated state or a stored state, respectively, prior to the pre-assembly state per se. On account thereof, the conductor or the plurality of conductors are also fixed in a preliminary manner in the desired relative positions thereof in the sandwich component and in the assembly step are fixed in a final manner by the adhesive and by being embedded between further components.

Therefore, in one preferred embodiment, at least one fibrous layer, which is coprocessed as a component likewise in the assembly step, is incorporated as a further component in the sandwich component in the pre-assembly state. In particular, the fibrous layer is a component part of a prepreg layer. In this case, an adhesive is incorporated together with the fibrous layer in the sandwich component at the respective point in the pre-assembly state.

In one preferred embodiment, an adhesive layer is incorporated between adjacent components in the pre-assembly state. As described above, this takes place either in the form of a prepreg layer together with a fibrous layer, or also alternatively thereto, without any additional fibrous layer, only by incorporating an adhesive. Incorporating takes place in the form of adhesive sheets, for example. The latter are somewhat comparable to a prepreg without fibrous material. The adhesive layer in the finished component leads to secure mutual retention of adjacent components.

In one variant of this embodiment, the adhesive layer prior to the pre-assembly state is applied to one of the other components or is integrated therein. The conductor layer or the structural layer here may thus also be connected to an adhesive in the manner of a prepreg, for example, so that the adhesive is incorporated in the sandwich component together with the respective component.

In one preferred embodiment a breakthrough is produced in the barrier layer and optionally in further elements of the sandwich component. After manufacturing of the sandwich component a contact portion of the conductor is accessible from the external space via this breakthrough. A sealing region which surrounds the breakthrough is then formed on the barrier layer. The sealing region is connectable in a vapour-tight manner to a sealing element. In particular, connecting is performed after completion of the sandwich component per se, that is to say after the assembly step.

In particular, production of the breakthrough may be performed already during manufacturing of the barrier layer. As a result, a contact plug for establishing electrical contact with the contact portion, which forms a tight continuation of the sealing element, is to be created, for example, so that vapour-tightness is also created in the region of the plug. In other words, no vapour is to penetrate between the plug and the sealing element. The sealing element per se then is likewise embodied in a vapour-tight manner and in the sealing region is connectable or connected, respectively, in a correspondingly tight manner to the barrier layer. In this way, the entire conductor together with the contact plug in the region of the breakthrough or of the contact portion, respectively, is surrounded or closed off, respectively, in a completely vapour-tight manner.

In particular, the sealing element is a casting compound which after completion of the sandwich component, that is to say after the assembly step, is applied or is connected to the sealing region. In the case of a socket or a plug being attached to the sandwich component or to the contact portion, respectively, the sealing element may also be a socket seal or a plug seal. The socket and plug seals are then likewise attached to the sealing region in a tight manner.

In this way, there is the potential for the complete conductor to be completely sealed in a vapour-tight manner even at linking points. According to the invention, the barrier layers in the construction of the sandwich component function as water barriers and thus protect the conductor against wetting. According to the preferred embodiment, other vulnerable regions, such as conductor outlets, are also protected against wetting.

The present invention is also achieved by a sandwich component wherein said sandwich component in particular is a cabin panel for a passenger cabin of a vehicle, in particular of an aircraft. The sandwich component has a first and a second flat side which delimit the sandwich component in relation to the external space. In particular, the sandwich component is manufactured according to the method according to the invention. At least one shape-imparting structural layer, in particular a honeycomb core, and at least one conductor layer having at least one electrical conductor, in particular a copper conductor, are disposed in the sandwich component. The structural layer and the conductor layer are disposed as components between the flat sides. All components of the sandwich component are interconnected with the aid of an adhesive, in particular of a resin. On both sides of the conductor layer that face towards the first and second flat side in each case a first and a second barrier layer, in particular polyvinyl fluoride layers, which are vapour-tight, are present as further components. The two barrier layers, in particular laterally of the conductor, are interconnected in such a manner that said two barrier layers enclose the conductor in a vapour-tight manner. In other words, the first barrier layer is disposed between the conductor layer and the first flat side, and the second barrier layer is disposed between the conductor layer and the second flat side. The two conductor layers also form components which are connected in the sandwich component with the aid of the adhesive.

The sandwich component also in terms of the advantages and preferred embodiments thereof has already been set forth in an analogous manner in the context of the above-mentioned method. This also applies to preferred embodiments of which a few will be again mentioned briefly and explicitly hereunder.

In one preferred embodiment, the two barrier layers in the form of lateral protrusions protrude beyond the conductor. On account of the adhesive in particular, the protrusions are interconnected in a tight manner.

In one preferred embodiment, the barrier layers are disposed on both sides of the conductor layer as directly adjacent components.

In one preferred embodiment, the conductor layer contains a supporting layer, in particular an adhesive and/or fibrous layer. At least in a pre-assembly state as described above the conductor is fixed in the nominal position as described above to the supporting layer.

In one preferred embodiment, the sandwich component contains at least one fibrous layer as a further component. The fibrous layer as a component is also connected in the sandwich component with the aid of the resin.

In one preferred embodiment, a breakthrough is present in the barrier layer and optionally in further elements of the sandwich component. A contact portion of the conductor is accessible from the external space of the sandwich component via the breakthrough. A sealing region which surrounds the breakthrough is present on the barrier layer. The sealing region is connectable in a vapour-tight manner to a sealing element.

BRIEF DESCRIPTION OF THE DRAWINGS

Further features, effects, and advantages of the invention are derived from the following description of a preferred embodiment of the invention, and from the appended figures in which.

DETAILED DESCRIPTION OF THE INVENTION

Figure 1:
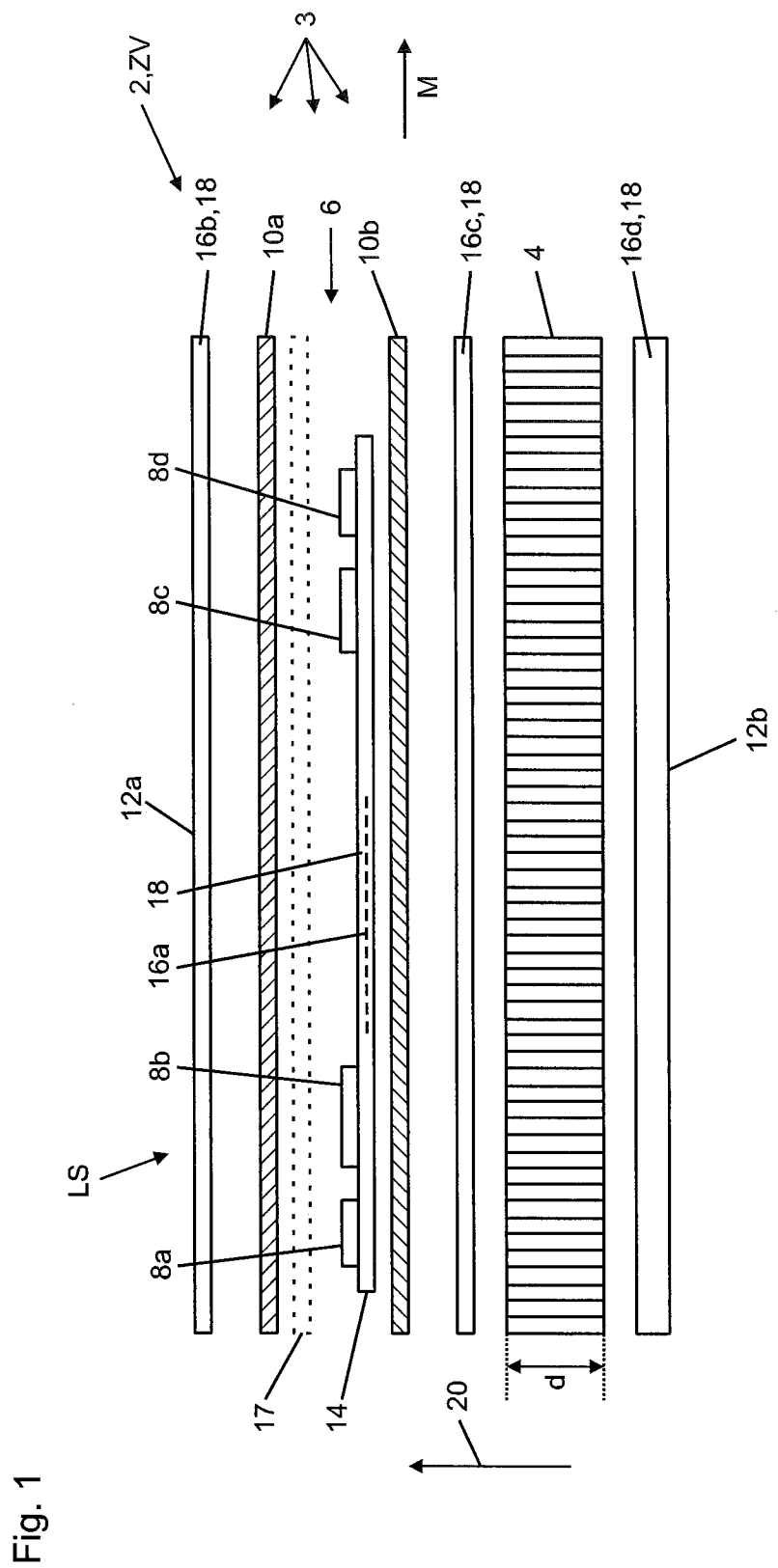
FIG. 1 shows a sandwich component in a pre-assembly state.

FIG. 1 shows a sandwich component 1 which is still in the making and in a pre-assembly state ZV, for example during laying-up in an assembly mould (not illustrated), in a symbolic illustration which is not to scale. The sandwich component 2 to be made is a cabin panel for a passenger cabin of an aircraft in the example. The sandwich component has the following components 3:

a shape-imparting structural layer 4, in the example a honeycomb core "Honeycomb (ABS 5035A1-50), having a thickness d of 5 millimeters;

a conductor layer 6 which contains electrical conductors 8a-d, in the example copper conductors, which in the example extend longitudinally in the manner of conductor paths, so as to be perpendicular to the drawing plane;

a first vapour-tight and water-tight barrier layer 10a which is disposed between the conductor layer 6 and a later first flat side 12a of the sandwich component 2;

a second barrier layer 10b which is disposed between the conductor layer 6 and a later second flat side 12b of the sandwich component 2.

The barrier layers 10a,b are vapour-tight and water-tight and in the example are polyvinyl fluoride layers in the form of a white "Tedlar" film of manufacturers DuPont, having a thickness of 35 μm. The electrical conductors 8a-d represent copper pads or lines, respectively.

The sandwich component 2 as further components 3 (the adhesive 18 here is not to be understood to be such a "component") contains:

a supporting layer 14 which in the example is part of the conductor layer 6 and in turn contains a fibrous layer 16a and an adhesive 18 in the form of a resin. The supporting layer 14 is a prepreg component "Glass ABS 5047-01T2", having a thickness of 0.1 millimeter;

a further fibrous layer 16b having an adhesive 18 as a terminal layer on the first flat side 12a, likewise as a prepreg component "ABS 5047-01T2", having a thickness of 0.1 millimeter;

a corresponding fibrous layer 16c having an adhesive 18 between the second barrier layer 10b and the structural layer 4, again as a prepreg component "Glass ABS 5047-01T2", having a thickness of 0.1 millimeter;

a fibrous layer 16d having an adhesive 18, provided for forming the second flat side 12b on the corresponding side of the structural layer 4 and again as a prepreg "Glass (prepreg) ABS 5047-07T2", having a thickness of 0.25 millimeter.

The supporting layer 14 serves for fixing the conductors 8a-d in a desired relative position or in a nominal position LS, respectively, within or in relation to the other component parts of the sandwich component 2, respectively, both in the pre-assembly state ZV as well as during the assembly step M. In this way, the conductors 8a-d also in the finished sandwich component 2 lie in a desired nominal position within said finished sandwich component, or have a desired nominal profile, respectively. The remaining component parts of the sandwich component 2 are also placed or fixed as desired in corresponding nominal positions LS in relation to one another.

FIG. 1 shows an alternative embodiment in which the adhesive 18 is incorporated in the form of an adhesive layer 17, presently as an adhesive sheet, in the sandwich construction in the pre-assembly state. Said adhesive layer 17 in the example serves for adhesively bonding the first barrier layer 10a in a particularly good manner to the conductors 8a-d.

The fibrous layer 16c containing the glass prepreg serves for guaranteeing adhesion between the second barrier layer 10b and the structural layer 4.

All thicknesses d are stated in the direction of the transverse direction 20 which is transverse to the flat sides 12a,b, and in FIG. 1 are illustrated in a merely exemplary manner for the structural layer 4. The barrier layers 10a,b form the components of the sandwich component 2 which are directly adjacent to the conductor layer 6, since no further "components" in the context of the present application but only an adhesive 18 are disposed therebetween, in particular in the completed state.

In an assembly step M which is symbolically illustrated by an arrow, all components of the sandwich component 2 are mutually compressed in the mould (not illustrated) under the influence of heat. On account thereof, the respective adhesive 18 in the sandwich component 2 is initially liquefied and then cured. The adhesive 18 here bonds with adjacent elements or components of the sandwich component, respectively, and/or at least partially penetrates said elements or components. On account thereof, said adhesive causes mutual bonding of said elements and components. In the assembly step M, the electrical conductors 8a-d are also at least partially enclosed by the adjacent components, presently the barrier layers 10a,b and/or by the adhesive 18.

Figure 2:
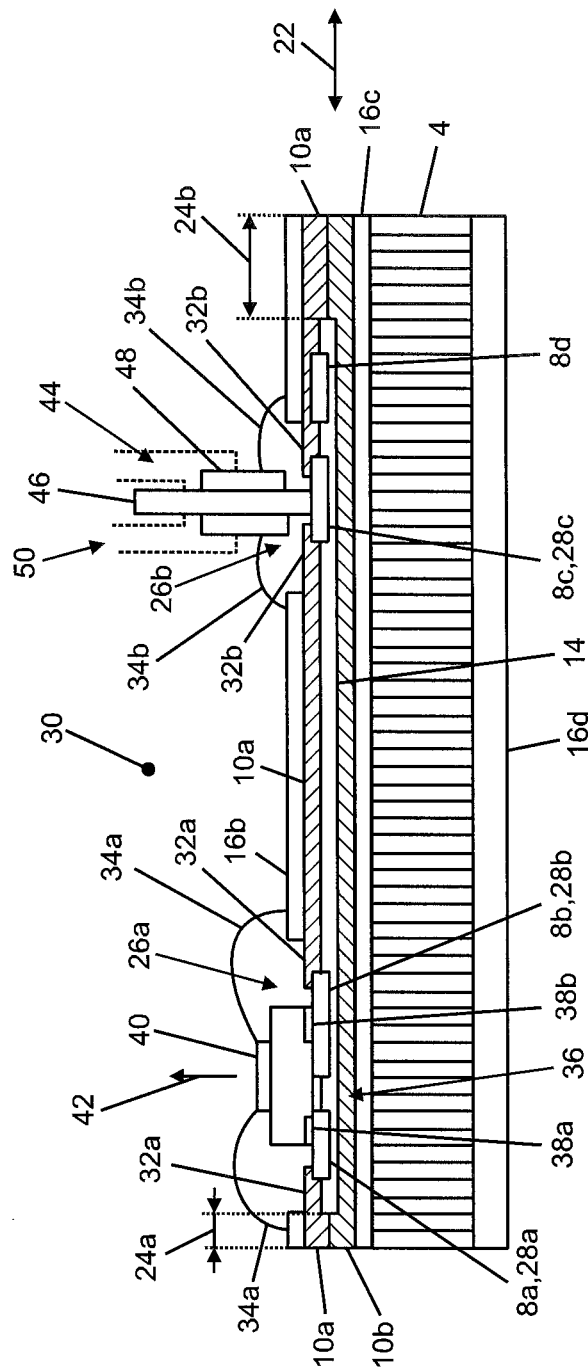
FIG. 2 shows the sandwich component of FIG. 1 after the assembly step and having electrical components applied thereto.

FIG. 2 shows the sandwich component 2 which has been created after the assembly step M. After the assembly step M, the two barrier layers 10a,b enclose the conductors 8a-d in a vapour-tight manner, since they were interconnected in a vapour-tight manner in the assembly step M. Since the conductors 8a-d extend longitudinally, perpendicularly to the drawing plane, connecting of the barrier layers 10a,b takes place in the direction of the double arrow 22 on both sides which are lateral of the conductors 8a-d.

In the example, the barrier layers 10a,b for achieving tightness are interconnected in the assembly step M with the aid of the adhesive 18. More specifically, connecting takes place in that the barrier layers 10a,b protrude beyond the conductors 8a-d, in the example the conductor 8a-d together with the supporting layer 14 thereof, and thus the entire conductor layer 6, in the form of lateral protrusions 24a,b.

In the embodiment according to FIG. 1 the barrier layer 10a and the fibrous layer 16b in FIG. 2 would be illustrated as being continuous. However, FIG. 2 shows an alternative embodiment to that of FIG. 1, in which breakthroughs 26a,b have been produced or are present in the barrier layer 10a and in the fibrous layer 16b, respectively. Via the breakthroughs 26a,b the contact portions 28a-c of the conductors 8a-c are accessible from an external space 30 of the sandwich component 2. Sealing regions 32a and 32b, which surround the respective breakthroughs 26a,b, are formed on the barrier layer 10a. A respective sealing element 34a,b is connected to the sealing regions 32a,b, in each case in a vapour-tight and water-tight manner. The sealing elements 34a,b per se are also embodied in a vapour-tight and water-tight manner. In particular, the sealing element 34a,b is an adhesive, in particular the product "Scotch Weld 7326".

An illumination element 36 which per se is vapour-tight, is installed in the breakthroughs 26a. The illumination element 36 contains two electrical contacts 38a,b which are connected to the electrical conductors 8a,b. Moreover, said illumination element 36 contains a light-emitting diode 40 for emitting light 42, indicated by an arrow in FIG. 2. The sealing element 34a is disposed in such a manner that it is connected in a vapour-tight and water-tight manner to the illumination element 36, but the light-emitting diode 40 nevertheless is exposed in order to emit light 42. Thus, a visually non-transparent sealing element 34a may be used, which is of advantage in particular in aerospace manufacturing, since the sealing element may contain fire retardants, for example.

A connector plug 44 having a plug contact 46 and a housing 48 is attached to the conductor 28c. The conductor 28c is electrically connected to the plug contact 46. The connector plug 44 per se is embodied in a vapour-tight manner and by way of the sealing element 34b, in a corresponding manner to the sealing element 32a, is cast-bonded in a vapour-tight manner, as has been set forth above, that is to say is connected to the sealing region 32b. A connector socket 50 which is indicated only by dashed lines may in turn be connected to the connector plug 44 in a vapour-tight manner.

Both breakthroughs 26a,b of the barrier layer 10a, which are illustrated in FIG. 2, are thus again sealed or closed in a vapour-tight manner. In a corresponding manner, all potential further breakthroughs, including any not illustrated in FIG. 2, in and between the barrier layers 10a,b are closed, such that an overall vapour-tight sheathing is formed around all conductors 8a-c by the barrier layers 10a,b and by further sealing means such as the sealing elements 34a,b, etc.

LIST OF REFERENCE SIGNS

2 Sandwich component
3 Component
4 Structural layer
6 Conductor layer
8a-d Electrical conductor
10a,b First, second barrier layer
12a,b First, second flat side
14 Supporting layer
16a-d Fibrous layer
17 Adhesive layer
18 Adhesive
20 Transverse direction
22 Double arrow
24a,b Lateral protrusions
26a,b Breakthroughs
28a-c Contact portion
30 External space
32a,b Sealing region
34a,b Sealing element
36 Illumination element
38a,b Electrical contacts
40 Light-emitting diode
42 Light
44 Connector plug
46 Plug contact
48 Housing
50 Connector socket
d Thickness
M Assembly step
ZV Pre-assembly state
LS Nominal position

What is claimed is:

1. A method for manufacturing a sandwich component, the sandwich component having a first and a second flat side, comprising:
   in a pre-assembly state, placing all the elements of the sandwich component in relation to one another, in a nominal position, wherein the elements comprise at least one shape-imparting structural layer, at least one conductor layer having at least one electrical conductor, and at least one adhesive containing fibrous layer;
   assembling said elements in an assembly step by interconnecting said elements with the aid of an adhesive, to produce the sandwich component, the method further comprising:
   placing, in the pre-assembly state, on each of the two sides of the conductor layer a first and a second barrier layer, respectively, which are in each case vapour-tight, from the other elements, and
   interconnecting the two barrier layers during the assembly step in such a manner that after the assembly step said two barrier layers enclose the conductor in a vapour-tight manner, and wherein the sandwich component is a cabin panel for a passenger cabin in an aircraft.

2. The method according to claim 1, wherein the two barrier layers are connected so that lateral protrusions protrude beyond the conductor, and the protrusions are interconnected in a tight manner.

3. The method according to claim 1, wherein the barrier layers in the pre-assembled state are disposed on both sides of the conductor layer as directly adjacent components.

4. The method according to claim 1, wherein a conductor layer which contains a supporting layer, which at least in the pre-assembly state fixes the conductor in the nominal position, is incorporated in the pre-assembly state.

5. The method according to claim 4, wherein said supporting layer is an adhesive and/or fibrous layer.

6. The method according to claim 1, wherein at least one additional fibrous layer is incorporated as a further component in the pre-assembly state.

7. The method according to claim 1, wherein an adhesive layer is incorporated between adjacent components in the pre-assembly state.

8. The method according to claim 7, wherein the adhesive layer prior to the pre-assembly state is applied to one of the components or is integrated therein.

9. The method according to claim 1, wherein a breakthrough via which after manufacturing of the sandwich component a contact portion of the conductor is accessible from the external space is produced in the barrier layer and optionally in further elements of the sandwich component, and a sealing region which surrounds the breakthrough and is connectable in a vapour-tight manner to a sealing element is formed on the barrier layer.

10. The method according to claim 1, wherein said at least one shape-imparting structural layer is a honeycomb core and said at least one electrical conductor of said at least one conductor layer is a copper conductor.

11. The method according to claim 1, wherein said adhesive is a resin.

12. The method according to claim 1, wherein said first and second barrier layers are polyvinyl fluoride layers, and said two barrier layers are interconnected laterally of the conductor.

* * * * *